United States Patent
Kim et al.

(10) Patent No.: US 11,295,799 B2
(45) Date of Patent: Apr. 5, 2022

(54) DEVICES FOR PERFORMING A REFRESH OPERATION BASED ON POWER CONTROL OPERATION

(71) Applicant: SK hynix Inc., Icheon-si Gyeonggi-do (KR)

(72) Inventors: Kyung Mook Kim, Icheon-si Gyeonggi-do (KR); Do Hong Kim, Hwaseong-si Gyeonggi-do (KR); Woongrae Kim, Icheon-si Gyeonggi-do (KR); Sang Il Park, Yongin-si Gyeonggi-do (KR); Sang Woo Yoon, Seoul (KR); Jong Seok Han, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 16/931,192

(22) Filed: Jul. 16, 2020

(65) Prior Publication Data

US 2021/0327493 A1 Oct. 21, 2021

(30) Foreign Application Priority Data

Apr. 16, 2020 (KR) .................. 10-2020-0046330

(51) Int. Cl.
| | |
|---|---|
| G11C 11/406 | (2006.01) |
| G11C 11/4094 | (2006.01) |
| G11C 11/4072 | (2006.01) |
| G11C 11/4074 | (2006.01) |
| G11C 11/4091 | (2006.01) |

(52) U.S. Cl.
CPC .... *G11C 11/40615* (2013.01); *G11C 11/4072* (2013.01); *G11C 11/4074* (2013.01); *G11C 11/4091* (2013.01); *G11C 11/4094* (2013.01)

(58) Field of Classification Search
CPC .......... G11C 11/40615; G11C 11/4091; G11C 11/4072; G11C 11/4074; G11C 11/4094
See application file for complete search history.

(56) References Cited

U.S. PATENT DOCUMENTS

| | | | | |
|---|---|---|---|---|
| 2010/0271892 A1* | 10/2010 | Chu | .................. | G11C 8/12 |
| | | | | 365/203 |
| 2018/0233192 A1 | 8/2018 | Won et al. | | |

FOREIGN PATENT DOCUMENTS

KR 1020180076842 A 7/2018

\* cited by examiner

*Primary Examiner* — Sultana Begum
(74) *Attorney, Agent, or Firm* — William Park & Associates Ltd.

(57) ABSTRACT

A device for performing a refresh operation includes a row control circuit and a row decoder. The row control circuit is configured to generate a bank active signal and a row address for controlling an active operation for a first memory bank based on a refresh signal. The row control circuit is also configured to generate the bank active signal for controlling the active operation for a second memory bank based on a power control signal. The row decoder is configured to receive the bank active signal and the row address to control the active operation for the first memory bank and the second memory bank.

16 Claims, 17 Drawing Sheets

DEVICES FOR PERFORMING A REFRESH OPERATION BASED ON POWER CONTROL OPERATION

CROSS-REFERENCE TO RELATED APPLICATIONS

The present application claims priority under 35 U.S.C. 119(a) to Korean Application No. 10-2020-0046330, filed on Apr. 16, 2020, which is incorporated herein by reference in its entirety.

BACKGROUND

1. Technical Field

Embodiments of the present disclosure relate to devices for performing a refresh operation.

2. Related Art

Dynamic random access memory (DRAM) semiconductor devices may lose information (i.e., data) stored in cell arrays thereof as time elapses even though their power supply voltages are supplied, unlike static random access memory (SRAM) devices and flash memory devices. Thus, the DRAM devices may periodically perform an operation for sensing and amplifying levels of data stored in the cell arrays in order to prevent the data stored in the cell arrays from being lost. The operation for sensing and amplifying levels of data stored in the cell arrays may be referred to as a refresh operation. The refresh operation may be performed by activating word lines in the cell arrays at least once within a data retention time of memory cells disposed in the cell arrays in a bank to sense and amplify the levels the data. The data retention time may correspond to a maximum time that the memory cells can retain minimum charges which are required to reveal original data without any refresh operations.

SUMMARY

According to an embodiment, a device for performing a refresh operation includes a row control circuit and a row decoder. The row control circuit is configured to generate a bank active signal and a row address for controlling an active operation for a first memory bank based on a refresh signal. In addition, the row control circuit is configured to generate the bank active signal for controlling the active operation for a second memory bank based on a power control signal. The row decoder is configured to receive the bank active signal and the row address to control the active operation for the first memory bank and the second memory bank. The power control signal is generated to control driving a power signal which is supplied to a bit line sense amplifier to perform the active operation for the first memory bank.

According to another embodiment, a device for performing a refresh operation includes a section signal generation circuit, a first bank active signal generation circuit, and a second bank active signal generation circuit. The section signal generation circuit is configured to generate a section signal based on the refresh signal. The first bank active signal generation circuit is configured to generate a first bit signal of a bank active signal, which is activated to perform an active operation for a first memory bank, based on the section signal. The second bank active signal generation circuit is configured to generate a second bit signal of the bank active signal, which is activated to perform the active operation for a second memory bank, based on the section signal and a power control signal. The power control signal is generated to control driving a power signal which is supplied to a bit line sense amplifier to perform the active operation for the first memory bank.

DETAILED DESCRIPTION OF THE EMBODIMENTS

In the following description of the embodiments, when a parameter is referred to as being "predetermined," it may be intended to mean that a value of the parameter is determined in advance when the parameter is used in a process or an algorithm. The value of the parameter may be set when the process or the algorithm starts or may be set while the process or the algorithm is executing.

It will be understood that although the terms "first," "second," "third," etc. are used herein to describe various elements, these elements should not be limited by these terms. These terms are only used to distinguish one element from another element, and not to indicate an overall number or sequential order of elements.

Thus, a first element in some embodiments could be termed a second element in other embodiments, or vice versa, without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure are described in detail hereinafter with reference to the accompanying drawings. However, the embodiments described herein are for illustrative purposes only and are not intended to limit the scope of the present disclosure.

Figure 1:
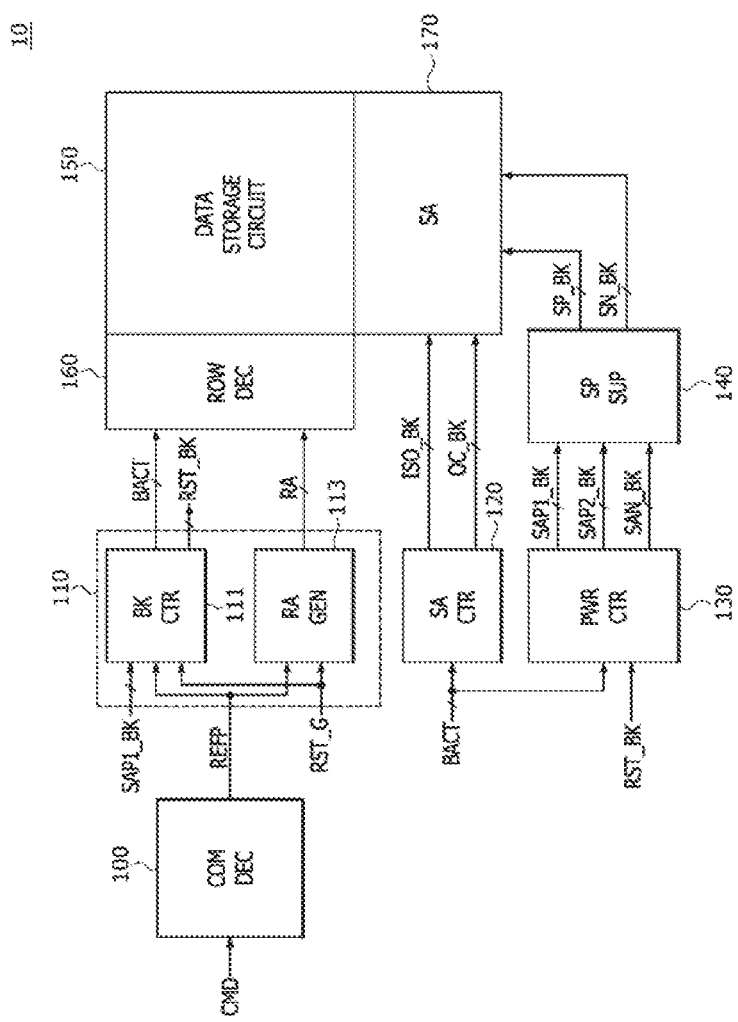
FIG. 1 is a block diagram illustrating a configuration of a semiconductor device according an embodiment of the present disclosure.

FIG. 1 is a block diagram illustrating a configuration of a semiconductor device 10 according an embodiment of the present disclosure. As illustrated in FIG. 1, the semiconductor device 10 may include a command decoder 100, a row control circuit 110, a sense amplification control circuit 120, a power control circuit 130, a power supply circuit 140, a data storage circuit 150, a row decoder 160, and a sense amplification circuit 170.

The command decoder (COM_DEC) 100 may receive a command COM from an external device. The external device may include a processor or a test apparatus corresponding to a controller or a host. The command decoder 100 may decode the command COM to activate a refresh signal REFP for performing a refresh operation. Although the refresh signal REFP is activated with a pulse having a logic "high" level in the present embodiment, the present embodiment is merely an example of the present disclosure. Accordingly, in some other embodiments, the refresh signal REFP may be activated in one of various different ways.

The row control circuit 110 may include a bank control circuit (BK_CTR) 111 and a row address generation circuit (RA_GEN) 113. The bank control circuit 111 may receive the refresh signal REFP from the command decoder 100 and may also receive a first power control signal SAP1_BK from the power control circuit 130. The bank control circuit 111 may generate a bank active signal BACT to sequentially perform active operations for a plurality of memory banks included in the data storage circuit 150 whenever the refresh signal REFP is activated. The bank active signal BACT may be set to include bits, the number of which is equal to the number of the memory banks included in the data storage circuit 150. For example, when the data storage circuit 150 is designed to have four memory banks, the bank active signal BACT may be set to have four bits. Although the number of the memory banks included in the data storage circuit 150 is set to be equal to the number of the bits included in the bank active signal BACT in the present embodiment, the number of the memory banks included in the data storage circuit 150 may be set to be different from the number of the bits included in the bank active signal BACT according to the embodiments. The bank control circuit 111 may generate a bank reset signal RST_BK when the active operations for the memory banks terminates. The bank reset signal RST_BK may include bits which are activated for respective ones the memory banks. When the refresh operation is performed so that the active operations for the memory banks are sequentially performed, the bank control circuit 111 may control such that supply of a power source voltage (VDD of FIG. 9) is stopped by the first power control signal SAP1_BK in the active operation for one memory bank and the operation for the next memory bank is then performed. Thus, because periods for supplying the power source voltage VDD are not superposed each other during the active operations for the plurality of memory banks, a level of the power source voltage VDD may be less dropped to maintain a certain narrow range. The bank control circuit 111 may receive a reset signal RST_G and may initialize the bank active signal BACT when the reset signal RST_G is activated. The reset signal RST_G may be a signal which is activated to perform a reset operation during an initialization operation of the semiconductor device 10. The reset signal RST_G may be internally generated in the semiconductor device 10 or may be provided by an external device.

The row address generation circuit 113 may receive the refresh signal REFP from the command decoder 100. The row address generation circuit 113 may generate a row address RA which varies whenever the refresh signal REFP is activated. The row address generation circuit 113 may initialize the row address RA after all of logic level combinations included in the row address RA are generated. For example, when the memory banks constituting the data storage circuit 150 include cell arrays connected to 1024 word lines, the row address RA generated by the row address generation circuit 113 may be activated whenever the refresh signal REFP is activated to sequentially provide a first row address RA1 to a 1024$^{th}$ row address RA1024. More specifically, the row address generation circuit 113 may provide the first row address RA1 when the refresh signal REFP is activated a first time and may provide the second row address RA2 when the refresh signal REFP is activated a second time. Similarly, the row address generation circuit 113 may provide the 1024$^{th}$ row address RA1024 when the refresh signal REFP is activated a 1024$^{th}$ time. In such a case, the row address RA may include the first to 1024$^{th}$ row addresses RA1~RA1024. The row address generation circuit 113 may be initialized after the 1024$^{th}$ row address RA1024 is generated and may then sequentially generate the first to 1024$^{th}$ row addresses RA1~RA1024 again whenever the refresh signal REFP is activated. The first to 1024$^{th}$ row addresses RA1~RA1024 may be generated to correspond to respective ones of various logic level combinations of bit signals included in the row address RA. However, in some other embodiments, the first to 1024$^{th}$ row addresses RA1~RA1024 may be generated in one of various different ways. The row address generation circuit 113 may receive the reset signal RST_G and may initialize the row address RA when the reset signal RST_G is activated.

The sense amplification control circuit 120 may receive the bank active signal BACT from the bank control circuit 111. The sense amplification control circuit 120 may generate an isolation signal ISO_BK and an offset removal signal OC_BK for controlling the sense amplification circuit (SA) 170 when the active operations for the memory banks included in the data storage circuit 150 are performed according to the bank active signal BACT. Each of the isolation signal ISO_BK and the offset removal signal OC_BK may be set include a plurality of bits, the number of which are equal to the number of the memory banks included in the data storage circuit 150.

The power control circuit 130 may receive the bank active signal BACT and the bank reset signal RST_BK from the bank control circuit 111. The power control circuit 130 may generate the first power control signal SAP1_BK, a second power control signal SAP2_BK, and a third power control signal SAN_BK for driving a first power signal SP_BK and a second power signal SN_BK which are supplied to the sense amplification circuit 170 when the active operations for the memory banks included in the data storage circuit 150 are performed according to the bank active signal BACT and the bank reset signal RST_BK. Each of the first power control signal SAP1_BK, the second power control signal SAP2_BK, and the third power control signal SAN_BK may be set to have a plurality of bits, the number of which is equal to the number of the memory banks included in the data storage circuit 150.

The power supply circuit 140 may receive the first power control signal SAP1_BK, the second power control signal SAP2_BK, and the third power control signal SAN_BK from the power control circuit 130. The power supply circuit 140 may drive the first power signal SP_BK based on the first power control signal SAP1_BK and the second power control signal SAP2_BK. The power supply circuit 140 may drive the first power signal SP_BK to the power source voltage VDD when the first power control signal SAP1_BK is activated. The power supply circuit 140 may drive the first power signal SP_BK to a core voltage (VCORE of FIG. 9) when the second power control signal SAP2_BK is activated. The power source voltage VDD may be provided by an external device, and the core voltage VCORE may be generated from the power source voltage VDD to have a level which is lower than a level of the power source voltage VDD. Configurations of circuits for generating the power source voltage VDD and the core voltage VCORE may be different according to the embodiments. Levels of the power source voltage VDD and the core voltage VCORE may also be set to be different according to the embodiments. The power supply circuit 140 may drive the second power signal SN_BK based on the third power control signal SAN_BK. The power supply circuit 140 may drive the second power signal SN_BK to a ground voltage (VSS of FIG. 9) when the third power control signal SAN_BK is activated.

The data storage circuit 150 may include a plurality of memory banks, as mentioned previously. The number of the memory banks included in the data storage circuit 150 may be set to be different according to the embodiments. Each of the memory banks included in the data storage circuit 150 may include a cell array coupled to a plurality of word lines and a plurality of bit lines. The number of the word lines, the number of bit lines, and the number of memory cells included in the cell array may be set to be different according to the embodiments.

The row decoder 160 may receive the bank active signal BACT from the bank control circuit 111 and may receive the row address RA from the row address generation circuit 113. The row decoder 160 may select and activate one of the memory banks included in the data storage circuit 150 based on the bank active signal BACT. In addition, the row decoder 160 may select one of the word lines included in the activated memory bank based on the row address RA and may control such that the active operation for the memory cells connected to the selected word line is performed.

The sense amplification circuit 170 may include a plurality of bit line sense amplifiers (refer to 170_1 of FIG. 11) provided to sense and amplify levels of data stored in the plurality of cell arrays distinguished as the memory banks in the data storage circuit 150. The bit line sense amplifiers included in the sense amplification circuit 170 may receive the isolation signal ISO_BK and the offset removal signal OC_BK, which are distinguished according to the memory banks, from the sense amplification control circuit 120. The bit line sense amplifiers included in the sense amplification circuit 170 may perform a pre-charge operation, an offset removal operation, a charge sharing operation, an overdriving operation, and a sense/amplification operation based on the isolation signal ISO_BK and the offset removal signal OC_BK. The bit line sense amplifiers included in the sense amplification circuit 170 may receive the first power signal SP_BK and the second power signal SN_BK, which are distinguished according to the memory banks, from the power supply circuit 140. The first power signal SP_BK and the second power signal SN_BK may be driven to have different levels according to the embodiments.

Figure 2:
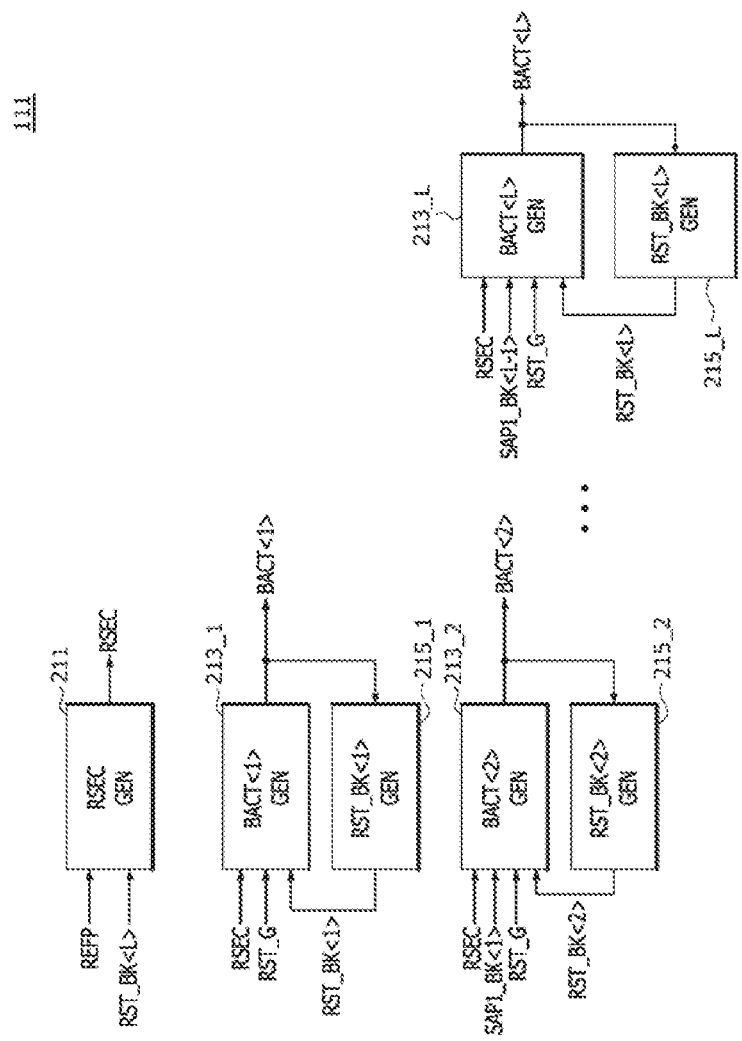
FIG. 2 is a block diagram illustrating a configuration of a bank control circuit included in the semiconductor device illustrated in FIG. 1.

FIG. 2 is a block diagram illustrating a configuration of the bank control circuit 111 included in the semiconductor device 10. As illustrated in FIG. 2, the bank control circuit 111 may include a section signal generation circuit 211, first to $L^{th}$ bank active signal generation circuits 213_1~213_L, and first to $L^{th}$ bank reset signal generation circuits 215_1~215_L. When the data storage circuit 150 is designed to include first to $L^{th}$ memory banks and the refresh a signal REFP is activated to perform the refresh operation, the section signal generation circuit 211 may sequentially perform the active operations for the first to $L^{th}$ memory banks. The number "L" may be set to be a natural number which is equal to or greater than "3."

The section signal generation circuit 211 may generate a section signal RSEC based on the refresh signal REFP and an $L^{th}$ bit signal RST_BK<L> of the bank reset signal RST_BK. The section signal generation circuit 211 may generate the section signal RSEC when the refresh signal REFP is activated. The section signal generation circuit 211 may inactivate the section signal RSEC when the $L^{th}$ bit signal RST_BK<L> of the bank reset signal RST_BK is activated by termination of the refresh operations for all of the memory banks. The $L^{th}$ bit signal RST_BK<L> of the bank reset signal RST_BK may be activated when the active operation for the $L^{th}$ memory bank terminates.

The first bank active signal generation circuit 213_1 may receive the section signal RSEC to generate a first bit signal BACT<1> of the bank active signal BACT. The first bank active signal generation circuit 213_1 may activate the first bit signal BACT<1> of the bank active signal BACT when the section signal RSEC is activated. The first bit signal BACT<1> of the bank active signal BACT may be activated to perform the active operation for the first memory bank. The first bank active signal generation circuit 213_1 may receive a first bit signal RST_BK<1> of the bank reset signal RST_BK and may inactivate the first bit signal BACT<1> of the bank active signal BACT to terminate the active operation for the first memory bank when the first bit signal RST_BK<1> of the bank reset signal RST_BK is activated. The first bank active signal generation circuit 213_1 may receive the reset signal RST_G and may initialize the first bit signal BACT<1> of the bank active signal BACT when the reset signal RST_G is activated. The first bit signal BACT<1> of the bank active signal BACT may be initialized to have an inactivated state.

The first bank reset signal generation circuit 215_1 may receive the first bit signal BACT<1> of the bank active signal BACT to generate the first bit signal RST_BK<1> of the bank reset signal RST_BK. The first bank reset signal generation circuit 215_1 may delay the first bit signal BACT<1> of the bank active signal BACT to generate the first bit signal RST_BK<1> of the bank reset signal RST_BK, which is activated in synchronization with a point in time when the active operation for the first memory bank terminates.

The second bank active signal generation circuit 213_2 may receive the section signal RSEC and a first bit signal SAP1_BK<1> of the first power control signal SAP1_BK to generate a second bit signal BACT<2> of the bank active signal BACT. The second bank active signal generation circuit 213_2 may activate the second bit signal BACT<2> of the bank active signal BACT when the section signal RSEC is activated and driving a first bit signal SP_BK<1> of the first power signal SP_BK for the active operation of the first memory bank is terminated by the first bit signal SAP1_BK<1> of the first power control signal SAP1_BK. The second bit signal BACT<2> of the bank active signal BACT may be activated to perform the active operation for the second memory bank. Because the first bit signal SAP1_BK<1> of the first power control signal SAP1_BK is activated during the offset removal operation and the overdriving operation of the bit line sense amplifier, the second bank active signal generation circuit 213_2 may activate the second bit signal BACT<2> of the bank active signal BACT by sensing a point in time when the offset removal operation and the overdriving operation of the bit line sense amplifier terminate during the active operation for the first memory bank through the first bit signal SAP1_BK<1> of the first power control signal SAP1_BK. The second bank active signal generation circuit 213_2 may receive a second bit signal RST_BK<2> of the bank reset signal RST_BK and may inactivate the second bit signal BACT<2> of the bank active signal BACT to terminate the active operation for the second memory bank when the second bit signal RST_BK<2> of the bank reset signal RST_BK is activated. The second bank active signal generation circuit 213_2 may receive the reset signal RST_G and may initialize the second bit signal BACT<2> of the bank active signal BACT when the reset signal RST_G is activated. The second bit signal BACT<2> of the bank active signal BACT may be initialized to have an inactivated state.

The second bank reset signal generation circuit 215_2 may receive the second bit signal BACT<2> of the bank active signal BACT to generate the second bit signal RST_BK<2> of the bank reset signal RST_BK. The second bank reset signal generation circuit 215_2 may delay the second bit signal BACT<2> of the bank active signal BACT to generate the second bit signal RST_BK<2> of the bank reset signal RST_BK, which is activated in synchronization with a point in time when the active operation for the second memory bank terminates.

The $L^{th}$ bank active signal generation circuit 213_L may receive the section signal RSEC and an $(L-1)^{th}$ bit signal SAP1_BK<L-1> of the first power control signal SAP1_BK to generate an $L^{th}$ bit signal BACT<L> of the bank active signal BACT. The $L^{th}$ bank active signal generation circuit 213_L may activate the $L^{th}$ bit signal BACT<L> of the bank active signal BACT when the section signal RSEC is activated and driving an $(L-1)^{th}$ bit signal SP_BK<L-1> of the first power signal SP_BK for the active operation of the first memory bank is terminated by the $(L-1)^{th}$ bit signal SAP1_BK<L-1> of the first power control signal SAP1_BK. The $L^{th}$ bit signal BACT<L> of the bank active signal BACT may be activated to perform the active operation for the $L^{th}$ memory bank. The $L^{th}$ bank active signal generation circuit 213_L may activate the $L^{th}$ bit signal BACT<L> of the bank active signal BACT by sensing a point in time when the offset removal operation and the overdriving operation of the bit line sense amplifier terminate during the active operation for the $(L-1)^{th}$ memory bank through the $(L-1)^{th}$ bit signal SAP1_BK<L-1> of the first power control signal SAP1_BK. The $L^{th}$ bank active signal generation circuit 213_L may receive an $L^{th}$ bit signal RST_BK<L> of the bank reset signal RST_BK and may inactivate the $L^{th}$ bit signal BACT<L> of the bank active signal BACT to terminate the active operation for the $L^{th}$ memory bank when the $L^{th}$ bit signal RST_BK<L> of the bank reset signal RST_BK is activated. The $L^{th}$ bank active signal generation circuit 213_L may receive the reset signal RST_G and may initialize the $L^{th}$ bit signal BACT<L> of the bank active signal BACT when the reset signal RST_G is activated. The $L^{th}$ bit signal BACT<L> of the bank active signal BACT may be initialized to have an inactivated state.

The $L^{th}$ bank reset signal generation circuit 215_L may receive the $L^{th}$ bit signal BACT<L> of the bank active signal BACT to generate the $L^{th}$ bit signal RST_BK<L> of the bank reset signal RST_BK. The $L^{th}$ bank reset signal generation circuit 215_L may delay the $L^{th}$ bit signal BACT<L> of the bank active signal BACT to generate the $L^{th}$ bit signal RST_BK<L> of the bank reset signal RST_BK, which is activated in synchronization with a point in time when the active operation for the $L^{th}$ memory bank terminates.

Figure 3:
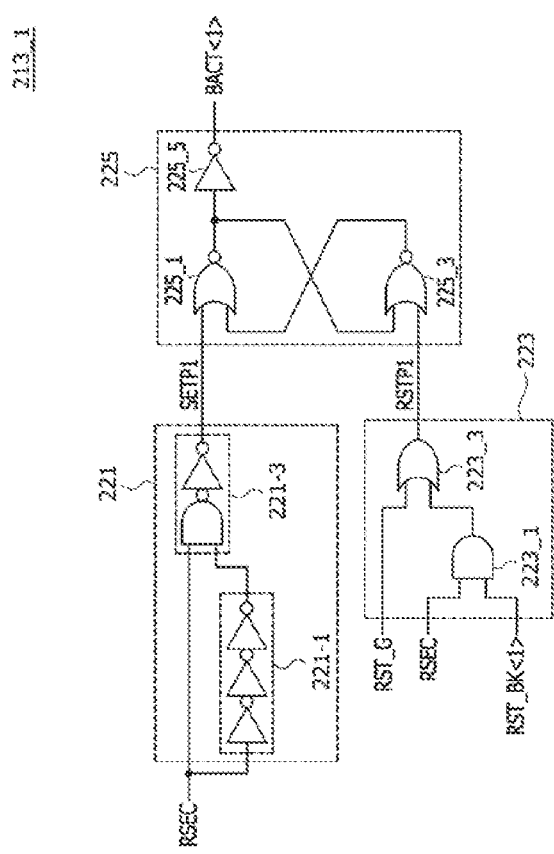
FIG. 3 is a circuit diagram illustrating a first bank active signal generation circuit included in the bank control circuit illustrated in FIG. 2.

FIG. 3 is a circuit diagram illustrating a configuration of the first bank active signal generation circuit 213_1 included in the bank control circuit 111. As illustrated in FIG. 3, the first bank active signal generation circuit 213_1 may include a first set pulse generation circuit 221, a first reset pulse generation circuit 223, and a first bank active signal output circuit 225.

The first set pulse generation circuit 221 may generate a first set pulse SETP1 which is activated to have a logic "high" level in synchronization with a point in time when the section signal RSEC is activated to have a logic "high" level. The first set pulse generation circuit 221 may include an inversion/delay part 221-1 and a set pulse output part 221-3. The inversion/delay part 221-1 may include an odd number of inverters which are connected in series and may inversely delay the section signal RSEC to output the inversely delayed signal of the section signal RSEC. The set pulse output part 221-3 may perform a logical AND operation of the section signal RSEC and an output signal of the inversion/delay part 221-1 to generate the first set pulse SETP1 which is transmitted to the inversion/delay part 221-1.

The first reset pulse generation circuit 223 may generate a first reset pulse RSTP1 which is activated to have a logic "high" level when the section signal RSEC is activated to have a logic "high" level and the active operation for the first memory bank terminates. The first reset pulse generation circuit 223 may include an AND gate 223_1 and an OR gate 223_3. The AND gate 223_1 may receive the section signal RSEC and the first bit signal RST_BK<1> of the bank reset signal RST_BK and may perform a logical AND operation of the section signal RSEC and the first bit signal RST_BK<1> of the bank reset signal RST_BK. The AND gate 223_1 may receive the first bit signal RST_BK<1> of the bank reset signal RST_BK, which is activated to have a logic "high" level, to output a signal having a logic "high" level when the active operation for the first memory bank terminates while the refresh operation is performed so that the section signal RSEC is activated to have a logic "high" level. The OR gate 223_3 may perform a logical OR operation of an output signal of the AND gate 223_1 and the reset signal RST_G to generate the first reset pulse RSTP1 which is transmitted to the first bank active signal output circuit 225. As mentioned previously, the reset signal RST_G may be a signal which is activated to have a logic "high" level in order to perform a reset operation during an initialization operation of the semiconductor device 10. The reset signal RST_G may be internally generated in the semiconductor device 10 or may be provided by an external device. The first reset pulse generation circuit 223 may generate the first reset pulse RSTP1 which is activated to have a logic "high" level when the reset signal RST_G is activated to have a logic "high" level.

The first bank active signal output circuit 225 may receive the first set pulse SETP1 from the first set pulse generation circuit 221 and may receive the first reset pulse RSTP1 from the first reset pulse generation circuit 223. The first bank active signal output circuit 225 may activate the first bit signal BACT<1> of the bank active signal BACT to output the first bit signal BACT<1> having a logic "high" level when the first set pulse SETP1 activated to have a logic "high" level is inputted to the first bank active signal output circuit 225. The first bank active signal output circuit 225 may inactivate the first bit signal BACT<1> of the bank active signal BACT to output the first bit signal BACT<1> having a logic "low" level when the first reset pulse RSTP1 activated to have a logic "high" level is inputted to the first bank active signal output circuit 225. The first bank active signal output circuit 225 may include NOR gates 225_1 and 225_3 and an inverter 225_5. The NOR gate 225_1 may receive the first set pulse SETP1 and an output signal of the NOR gate 225_3 and may perform a logical NOR operation of the first set pulse SETP1 and an output signal of the NOR gate 225_3. The NOR gate 225_3 may receive the first reset pulse RSTP1 and an output signal of the NOR gate 225_1 and may perform a logical NOR operation of the first reset pulse RSTP1 and an output signal of the NOR gate 225_1. The inverter 225_5 may inversely buffer an output signal of the NOR gate 225_1 to generate the first bit signal BACT<1> of the bank active signal BACT.

Figure 4:
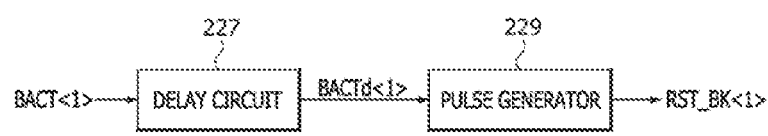
FIG. 4 is a block diagram illustrating a configuration of a first bank reset signal generation circuit included in the bank control circuit illustrated in FIG. 2.

FIG. 4 is a block diagram illustrating a configuration of the first bank reset signal generation circuit 215_1 included in the bank control circuit 111. As illustrated in FIG. 4, the first bank reset signal generation circuit 215_1 may include a delay circuit 227 and a pulse generator 229. The delay circuit 227 may delay the first bit signal BACT<1> of the bank active signal BACT to generate a first bit signal BACTd<1> of a delayed bank active signal BACTd. In such a case, a delay time of the delay circuit 227 may be set as a section during which the active operation of the first memory bank is performed. The pulse generator 229 may receive the first bit signal BACTd<1> of a delayed bank active signal BACTd to generate the first bit signal RST_BK<1> of the bank reset signal RST_BK. The first bank reset signal generation circuit 215_1 may generate the first bit signal RST_BK<1> of the bank reset signal RST_BK, which is activated in synchronization with a point in time when the active operation for the first memory bank is terminated by the first bit signal BACT<1> of the bank active signal BACT. Although the first bit signal RST_BK<1> of the bank reset signal RST_BK is activated in a pulse form in the present embodiment, the present embodiment may be merely an example of the present disclosure. Thus, the first bit signal RST_BK<1> of the bank reset signal RST_BK may be activated to have any one of various forms according to the embodiments. Each of the second to $L^{th}$ bank reset signal generation circuits 215_2~215_L illustrated in FIG. 2 may be realized to have the same circuit as the first bank reset signal generation circuit 215_1 described with reference to FIG. 4. Thus, detailed descriptions of the second to $L^{th}$ bank reset signal generation circuits 215_2~215_L will be omitted hereinafter.

Figure 5:
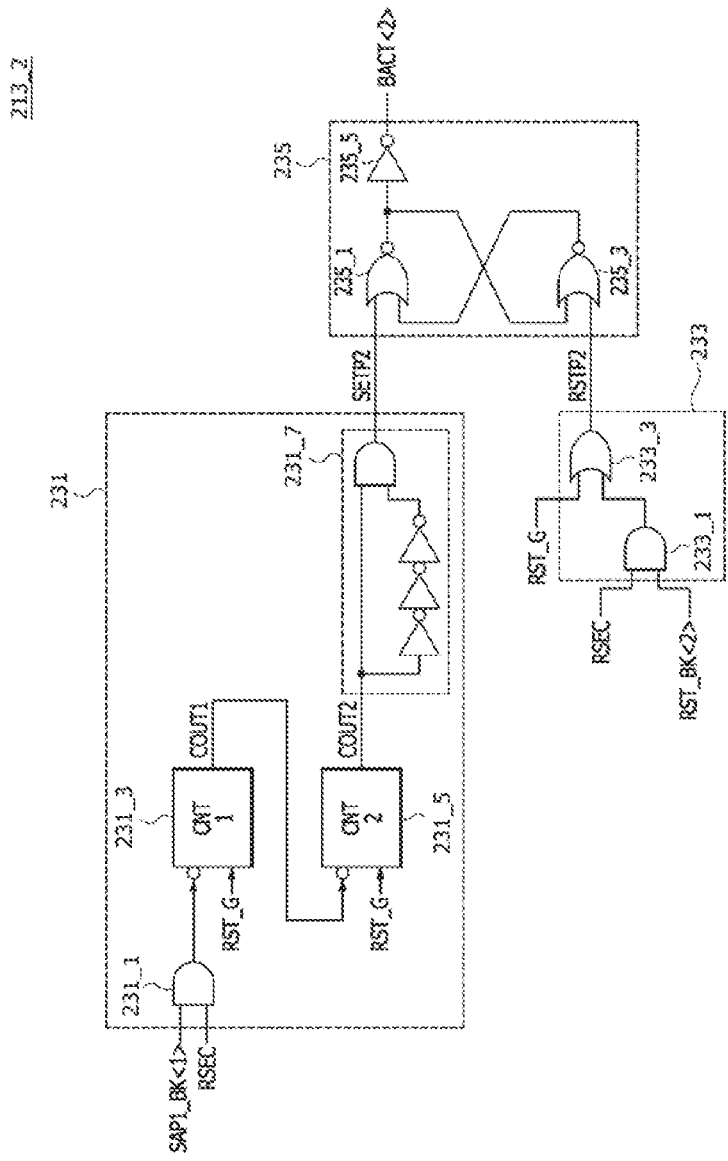
FIG. 5 is a circuit diagram illustrating a second bank active signal generation circuit included in the bank control circuit illustrated in FIG. 2.

FIG. 5 is a circuit diagram illustrating the second bank active signal generation circuit 213_2 included in the bank control circuit 111. As illustrated in FIG. 5, the second bank active signal generation circuit 213_2 may include a second set pulse generation circuit 231, a second reset pulse generation circuit 233, and a second bank active signal output circuit 235. Each of the third to $L^{th}$ bank active signal generation circuits 213_3~213_L illustrated in FIG. 2 may be realized to have the same circuit as the second bank active signal generation circuit 213_2 illustrated in FIG. 5. Thus, detailed descriptions of the third to $L^{th}$ bank active signal generation circuits 213_3~213_L will be omitted hereinafter.

The second set pulse generation circuit 231 may generate a second set pulse SETP2 which is activated to have a logic "high" level in synchronization with a point in time when driving the first bit signal SP_BK<1> of the first power signal SP_BK for the active operation of the first memory bank is terminated by the first bit signal SAP1_BK<1> of the first power control signal SAP1_BK while the section signal RSEC is activated. The second set pulse generation circuit 231 may include an AND gate 231_1, a first counter (CNT1) 231_3, a second counter (CNT2) 231_5, and a set pulse output circuit 231_7. The AND gate 231_1 may receive the section signal RSEC and the first bit signal SAP1_BK<1> of the first power control signal SAP1_BK and may perform a logical AND operation of the section signal RSEC and the first bit signal SAP1_BK<1> of the first power control signal SAP1_BK. The AND gate 231_1 may output a signal having a logic "high" level when the first bit signal SAP1_BK<1> of the first power control signal SAP1_BK activated to have a logic "high" level is inputted to drive the first bit signal SP_BK<1> of the first power signal SP_BK during the active operation for the first memory bank while the refresh operation is performed so that the section signal RSEC is activated to have a logic "high" level. The AND gate 231_1 may output a signal having a logic "low" level when the first bit signal SAP1_BK<1> of the first power control signal SAP1_BK inactivated to have a logic "low" level is inputted by termination of drive of the first bit signal SP_BK<1> of the first power signal SP_BK while the section signal RSEC is activated to have a logic "high" level. The first counter 231_3 may be initialized by the reset signal RST_G to output a first counter output signal COUT1 having a logic "low" level. The second counter 231_5 may be initialized by the reset signal RST_G to output a second counter output signal COUT2 having a logic "low" level. The first counter 231_3 may change a level of the first counter output signal COUT1 from a logic "low" level into a logic "high" level in synchronization with a first falling edge of the first bit signal SAP1_BK<1> of the first power control signal SAP1_BK when the offset removal operation of the bit line sense amplifier terminates during the activation operation for the first memory block so that driving the first bit signal SP_BK<1> of the first power signal SP_BK is stopped a first time. The first counter 231_3 may change a level of the first counter output signal COUT1 from a logic "high" level into a logic "low" level in synchronization with a second falling edge of the first bit signal SAP1_BK<1> of the first power control signal SAP1_BK when the overdriving operation of the bit line sense amplifier terminates during the activation operation for the first memory block so that driving the first bit signal SP_BK<1> of the first power signal SP_BK is stopped a second time. The second counter 231_5 may change a level of the second counter output signal COUT2 from a logic "low" level into a logic "high" level when a level of an output signal of the first counter 231_3 changes from a logic "high" level into a logic "low" level. The set pulse output circuit 231_7 may receive the second counter output signal COUT2 to generate the second set pulse SETP2 which is transmitted to the second bank active signal output circuit 235. The set pulse output circuit 231_7 may generate the second set pulse SETP2 which is activated to have a logic "high" level when the second counter output signal COUT2 is activated to have a logic "high" level. Although the second set pulse SETP2 is activated in a pulse form in the present embodiment, the present embodiment may be merely an example of the present disclosure. Thus, the second set pulse SETP2 may be activated to have any one of various forms according to the embodiments.

The second reset pulse generation circuit 233 may generate a second reset pulse RSTP2 which is activated to have a logic "high" level when the section signal RSEC is activated to have a logic "high" level and the active operation for the second memory bank terminates. The second reset pulse generation circuit 233 may include an AND gate 233_1 and an OR gate 233_3. The AND gate 233_1 may receive the section signal RSEC and the second bit signal RST_BK<2> of the bank reset signal RST_BK and may perform a logical AND operation of the section signal RSEC and the second bit signal RST_BK<2> of the bank reset signal RST_BK. The AND gate 233_1 may receive the second bit signal RST_BK<2> of the bank reset signal RST_BK, which is activated to have a logic "high" level, output a signal having a logic "high" level when the active operation for the second memory bank terminates while the refresh operation is performed so that the section signal RSEC is activated to have a logic "high" level. The OR gate 233_3 may perform a logical OR operaton of an output signal of the AND gate 233_1 and the reset signal RST_G to generate the second reset pulse RSTP2 which is transmitted to the second bank active signal output circuit 235. The second reset pulse generation circuit 233 may generate the second reset pulse RSTP2 which is activated to have a logic "high" level when the reset signal RST_G is activated to have a logic "high" level.

The second bank active signal output circuit 235 may receive the second set pulse SETP2 from the second set pulse generation circuit 231 and may receive the second reset pulse RSTP2 from the second reset pulse generation circuit 233. The second bank active signal output circuit 235 may activate the second bit signal BACT<2> of the bank active signal BACT to output the second bit signal BACT<2> having a logic "high" level when the second set pulse SETP2 activated to have a logic "high" level is inputted to the second bank active signal output circuit 235. The second bank active signal output circuit 235 may inactivate the second bit signal BACT<2> of the bank active signal BACT to output the second bit signal BACT<2> having a logic "low" level when the second reset pulse RSTP2 activated to have a logic "high" level is inputted to the second bank active signal output circuit 235. The second bank active signal output circuit 235 may include NOR gates 235_1 and 235_3 and an inverter 235_5. The NOR gate 235_1 may receive the second set pulse SETP2 and an output signal of the NOR gate 235_3 and may perform a logical NOR operation of the second set pulse SETP2 and an output signal of the NOR gate 235_3. The NOR gate 235_3 may receive the second reset pulse RSTP2 and an output signal of the NOR gate 235_1 and may perform a logical NOR operation of the second reset pulse RSTP2 and an output signal of the NOR gate 235_1. The inverter 235_5 may inversely buffer an output signal of the NOR gate 235_1 to generate the second bit signal BACT<2> of the bank active signal BACT.

Figure 6:
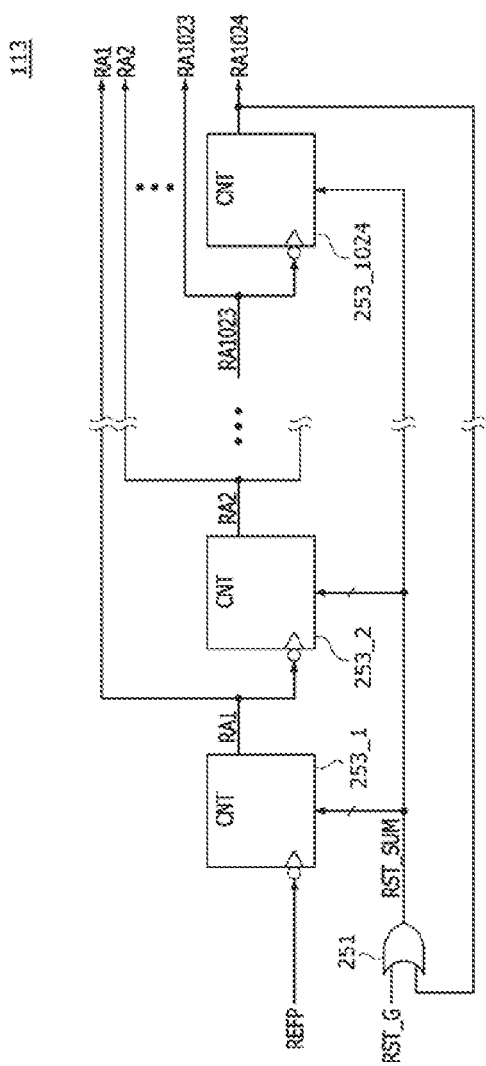
FIG. 6 illustrates a row address generation circuit included in the semiconductor device illustrated in FIG. 1.

FIG. 6 illustrates a configuration of the row address generation circuit 113. As illustrated in FIG. 6, the row address generation circuit 113 may include a synthesis reset signal generation circuit 251 and first to $1024^{th}$ counters 253_1~253_1024. The synthesis reset signal generation circuit 251 may receive the $1024^{th}$ row address RA1024 and the reset signal RST_G to perform a logical OR operation of the $1024^{th}$ row address RA1024 and the reset signal RST_G. The synthesis reset signal generation circuit 251 may generate a synthesis reset signal RST_SUM which is activated to have a logic "high" level when the $1024^{th}$ row address RA1024 or the reset signal RST_G is activated to have a logic "high" level. The first counter 253_1 may change a level of the first row address RA1 when a level transition of the refresh signal REFP occurs from a logic "high" level into a logic "low" level (hereinafter, referred to as a 'falling edge'). The first counter 253_1 may change a level of the first row address RA1 from a logic "high" level into a logic "low" level if the refresh signal REFP is activated a second time after the refresh signal REFP is activated a first time so that a level of the first row address RA1 changes from a logic "low" level into a logic "high" level. The first counter 253_1 may initialize the first row address RA1 into a logic "low" level when the synthesis reset signal RST_SUM is generated to have a logic "high" level. The second counter 253_2 may be synchronized with a falling edge of the first row address RA1 to change a level of the second row address RA2. The second counter 253_2 may change a level of the second row address RA2 from a logic "low" level into a logic "high" level in synchronization with a falling edge of the first row address RA1 which is generated after the refresh signal REFP is activated in a second time. The second counter 253_2 may initialize the second row address RA2 into a logic "low" level when the synthesis reset signal RST_SUM is generated to have a logic "high" level. The $1024^{th}$ counter 253_1024 may be synchronized with a falling edge of the $1023^{th}$ row address RA1023 to change a level of the $1024^{th}$ row address RA1024. The $1024^{th}$ counter 253_1024 may change a level of the $1024^{th}$ row address RA1024 from a logic "low" level into a logic "high" level in synchronization with a falling edge of the $1023^{th}$ row address RA1023 which is generated after the refresh signal REFP is activated in a $1024^{th}$ time. The $1024^{th}$ counter 253_1024 may initialize the $1024^{th}$ row address RA1024 into a logic "low" level when the synthesis reset signal RST_SUM is generated to have a logic "high" level.

Figure 7:
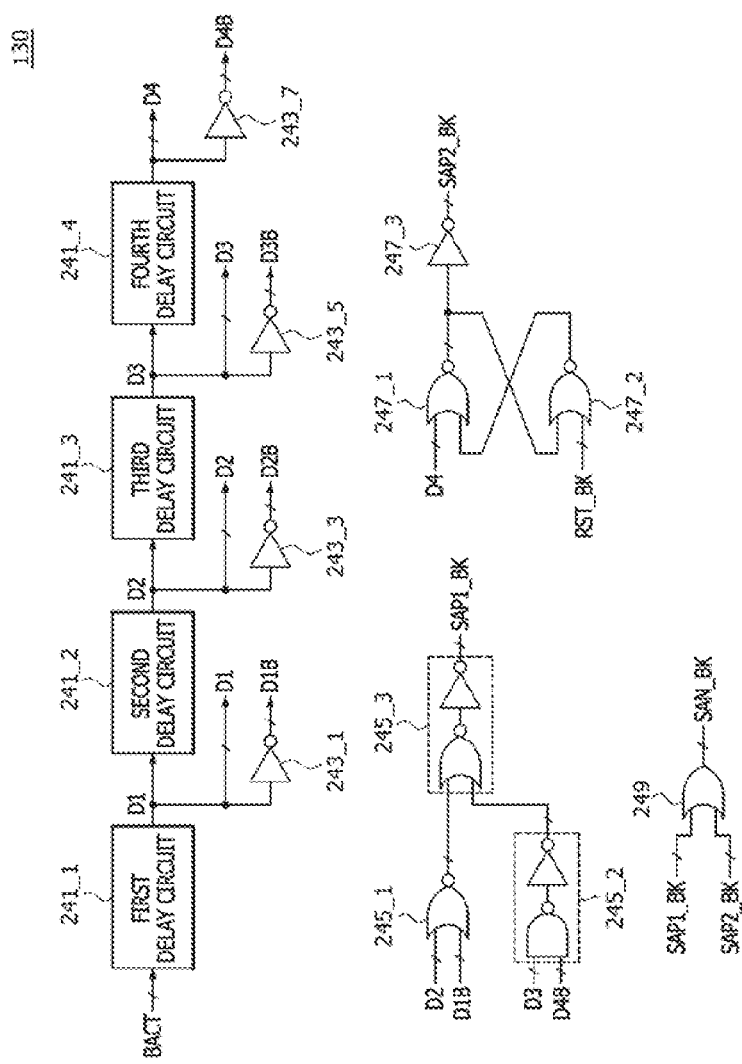
FIG. 7 illustrates a configuration of a power control circuit included in the semiconductor device illustrated in FIG. 1.

FIG. 7 is a block diagram illustrating a configuration of the power control circuit 130. As illustrated in FIG. 7, the power control circuit 130 may include a first delay circuit 241_1, a second delay circuit 241_2, a third delay circuit 241_3, a fourth delay circuit 241_4, inverters 243_1, 243_3, 243_5, 243_7, and 247_3, NOR gates 245_1, 247_1, and 247_2, a first logic circuit 245_2, a second logic circuit 245_3, and an OR gate 249. The first delay circuit 241_1 may delay the bank active signal BACT by a first delay time to generate a first delay signal D1. The first delay time may be set as a period during which the pre-charge operation of the bit line sense amplifier (170_1 of FIG. 11) is performed. The inverter 243_1 may inversely buffer the first delay signal D1 to generate a first inverted delay signal D1B. The second delay circuit 241_2 may delay the first delay signal D1 by a second delay time to generate a second delay signal D2. The second delay time may be set as a period during which the offset removal operation of the bit line sense amplifier is performed. The inverter 243_3 may inversely buffer the second delay signal D2 to generate a second inverted delay signal D2B. The third delay circuit 241_3 may delay the second delay signal D2 by a third delay time to generate a third delay signal D3. The third delay time may be set as a period during which the charge sharing operation of the bit line sense amplifier is performed. The inverter 243_5 may inversely buffer the third delay signal D3 to generate a third inverted delay signal D3B. The fourth delay circuit 241_4 may delay the third delay signal D3 by a fourth delay time to generate a fourth delay signal D4. The fourth delay time may be set as a period during which the overdriving operation of the bit line sense amplifier is performed. The inverter 243_7 may inversely buffer the fourth delay signal D4 to generate a fourth inverted delay signal D4B.

The NOR gate 245_1 may perform a logical NOR operation of the second delay signal D2 and the first inverted delay signal D1B to generate and output a signal having a logic "high" level when both of the second delay signal D2 and the first inverted delay signal D1B have a logic "low" level. The first logic circuit 245_2 may perform a logical AND operation of the third delay signal D3 and the fourth inverted delay signal D4B to generate and output a signal having a logic "high" level when both of the third delay signal D3 and the fourth inverted delay signal D4B have a logic "high" level. The second logic circuit 245_3 may perform a logical OR operation of an output signal of the NOR gate 245_1 and an output signal of the first logic circuit 245_2 to generate the first power control signal SAP1_BK. The first power control signal SAP1_BK may be activated to have a logic "high" level during the offset removal operation and the overdriving operation of the bit line sense amplifier. The first power control signal SAP1_BK may include bits which are activated to correspond to respective ones of the memory banks. The NOR gate 247_1 may receive the fourth delay signal D4 and an output signal of the NOR gate 247_2 to perform a logical NOR operation of the fourth delay signal D4 and an output signal of the NOR gate 247_2. The NOR gate 247_2 may receive the bank reset signal RST_BK and an output signal of the NOR gate 247_1 to perform a logic NOR operation of the bank reset signal RST_BK and an output signal of the NOR gate 247_1. The inverter 247_3 may inversely buffer an output signal of the NOR gate 247_1 to generate the second power control signal SAP2_BK. The second power control signal SAP2_BK may be activated to have a logic "high" level during the sense/amplification operation of the bit line sense amplifier. The second power control signal SAP2_BK may include bits which are activated to correspond to respective ones of the memory banks. The OR gate 249 may perform a logical OR operation of the first power control signal SAP1_BK and the second power control signal SAP2_BK to generate the third power control signal SAN_BK. The third power control signal SAN_BK may be activated to have a logic "high" level during the offset removal operation, the overdriving operation, and the sense/amplification operation of the bit line sense amplifier.

Figure 8:
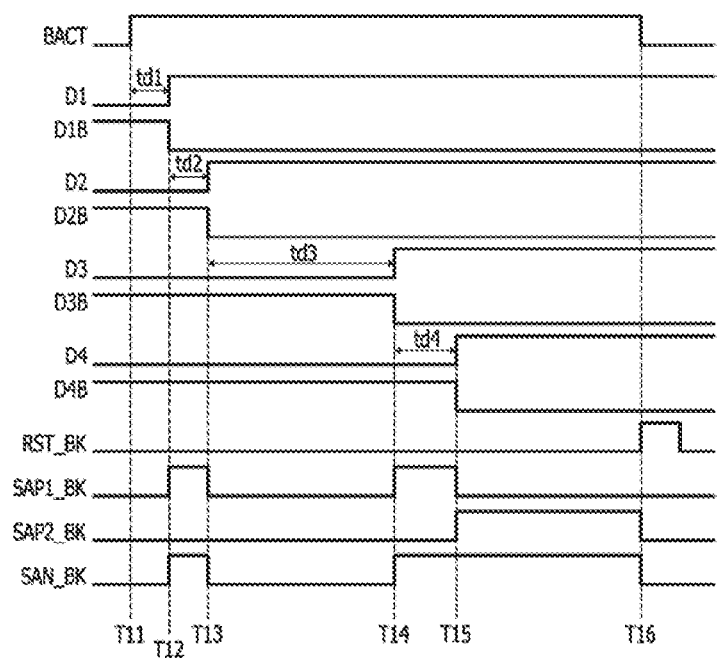
FIG. 8 is a timing diagram illustrating an operation of the power control circuit illustrated in FIG. 7.

An operation of the power control circuit 130 illustrated in FIG. 7 will be described more fully hereinafter with reference to FIG. 8.

First, when the refresh operation is performed so that the bank active signal BACT for a predetermined memory bank is activated to have a logic "high" level at a point in time "T11," a level of the first delay signal D1 may change from a logic "low" level into a logic "high" level and a level of the first inverted delay signal D1B may change from a logic "high" level into a logic "low" level in synchronization with a point in time "T12" when a first delay time "td1" elapses from the point in time "T11." The period "td1" from the point in time "T11" when the bank active signal BACT is activated to have a logic "high" level until the point in time "T12" when a level of the first delay signal D1 changes from a logic "low" level into a logic "high" level may be set as a period during which the pre-charge operation of the bit line sense amplifier is performed.

Next, a level of the second delay signal D2 may change from a logic "low" level into a logic "high" level and a level of the second inverted delay signal D2B may change from a logic "high" level into a logic "low" level, in synchronization with a point in time "T13" when a second delay time "td2" elapses from the point in time "T12." The period "td2" from the point in time "T12" when a level of the first delay signal D1 changes from a logic "low" level into a logic "high" level until the point in time "T13" when a level of the second delay signal D2 changes from a logic "low" level into a logic "high" level may be set as a period during which the offset removal operation of the bit line sense amplifier is performed. The first power control signal SAP1_BK and the third power control signal SAN_BK may be set to have a logic "high" level during the period "td2" (from the point in time "T12" until the point in time "T13") when both of the first inverted delay signal D1B and the second delay signal D2 are set to have a logic "low" level.

Next, a level of the third delay signal D3 may change from a logic "low" level into a logic "high" level and a level of the third inverted delay signal D3B may change from a logic "high" level into a logic "low" level, in synchronization with a point in time "T14" when a third delay time "td3" elapses from the point in time "T13." The period "td3" from the point in time "T13" when a level of the second delay signal D2 changes from a logic "low" level into a logic "high" level until the point in time "T14" when a level of the third delay signal D3 changes from a logic "low" level into a logic "high" level may be set as a period during which the charge sharing operation of the bit line sense amplifier is performed.

Next, a level of the fourth delay signal D4 may change from a logic "low" level into a logic "high" level and a level of the fourth inverted delay signal D4B may change from a logic "high" level into a logic "low" level, in synchronization with a point in time "T15" when a fourth delay time "td4" elapses from the point in time "T14." The period "td4" from the point in time "T14" when a level of the third delay signal D3 changes from a logic "low" level into a logic "high" level until the point in time "T15" when a level of the fourth delay signal D4 changes from a logic "low" level into a logic "high" level may be set as a period during which the overdriving operation of the bit line sense amplifier is performed. The first power control signal SAP1_BK and the third power control signal SAN_BK may be set to have a logic "high" level during the period "td4" (from the point in time "T14" until the point in time "T15") when both of the third delay signal D3 and the fourth inverted delay signal D4B are set to have a logic "high" level.

Finally, a period from the point in time "T15" when a level of the fourth delay signal D4 changes from a logic "low" level into a logic "high" level until a point in time "T16" when the bank reset signal RST_BK is activated to have a logic "high" level may be set as a period during which the sense/amplification operation of the bit line sense amplifier is performed. The second power control signal SAP2_BK and the third power control signal SAN_BK may be set to have a logic "high" level during the period (from the point in time "T15" until the point in time "T16") when the sense/amplification operation of the bit line sense amplifier is performed.

Figure 9:
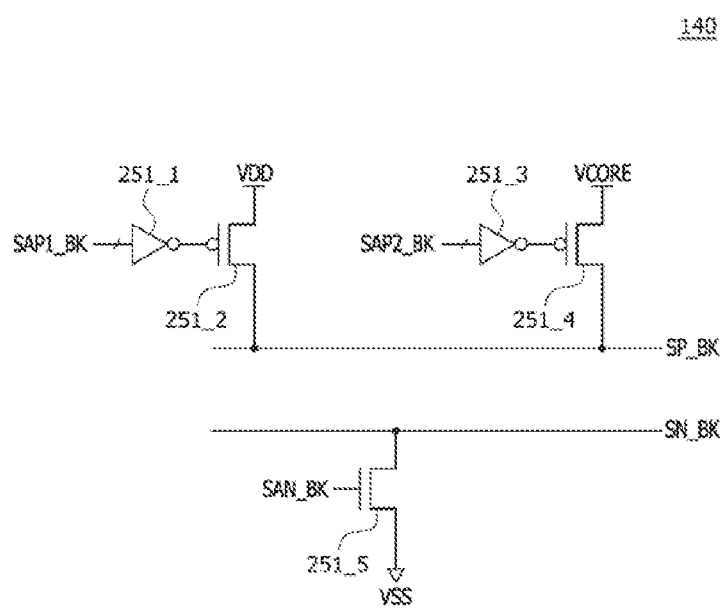
FIG. 9 is a circuit diagram illustrating a power supply circuit included in the semiconductor device illustrated in FIG. 1.

FIG. 9 is a block diagram illustrating a configuration of the power supply circuit 140. As illustrated in FIG. 9, the power supply circuit 140 may include inverters 251_1 and 251_3, PMOS transistors 251_2 and 251_4, and an NMOS transistor 251_5. The inverter 251_1 may inversely buffer the first power control signal SAP1_BK to output the inversely buffered signal of the first power control signal SAP1_BK. The PMOS transistor 251_2 may function as a switch which is turned on when the first power control signal SAP1_BK has a logic "high" level. The first power signal SP_BK may be driven to have the power source voltage VDD when the PMOS transistor 251_2 is turned on. The first power signal SP_BK may be driven to have the power source voltage VDD during the offset removal operation and the overdriving operation of the bit line sense amplifier. The inverter 251_3 may inversely buffer the second power control signal SAP2_BK to output the inversely buffered signal of the second power control signal SAP2_BK. The PMOS transistor 251_4 may function as a switch which is turned on when the second power control signal SAP2_BK has a logic "high" level. The first power signal SP_BK may be driven to have the core voltage VCORE when the PMOS transistor 251_4 is turned on. The first power signal SP_BK may be driven to have the core voltage VCORE during the sense/amplification operation of the bit line sense amplifier. The NMOS transistor 251_5 may function as a switch which is turned on when the third power control signal SAN_BK has a logic "high" level. The second power signal SN_BK may be driven to have the ground voltage VSS when the NMOS transistor 251_5 is turned on. The second power signal SN_BK may be driven to have the ground voltage VSS during the offset removal operation, the overdriving operation, and the sense/amplification operation of the bit line sense amplifier.

Figure 10:
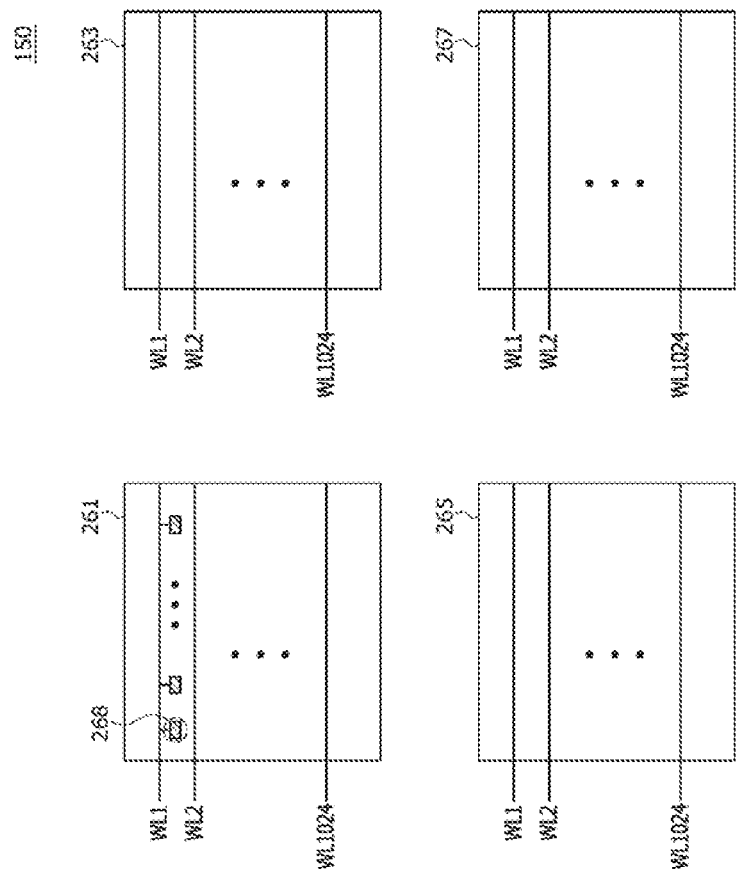
FIG. 10 illustrates a configuration of a data storage circuit included in the semiconductor device illustrated in FIG. 1.

FIG. 10 illustrates a configuration of the data storage circuit 150. As illustrated in FIG. 10, the data storage circuit 150 may include a first memory bank 261, a second memory bank 263, a third memory bank 265, and a fourth memory bank 267. Each of the first memory bank 261, the second memory bank 263, the third memory bank 265, and the fourth memory bank 267 may include a cell array connected to first to 1024$^{th}$ word lines WL1~WL1024. The first memory bank 261 may be activated when the first bit signal BACT<1> of the bank active signal BACT is activated. The second memory bank 263 may be activated when the second bit signal BACT<2> of the bank active signal BACT is activated. The third memory bank 265 may be activated when the third bit signal BACT<3> of the bank active signal BACT is activated. The fourth memory bank 267 may be activated when the fourth bit signal BACT<4> of the bank active signal BACT is activated. Each of the first to 1024$^{th}$ word lines WL1~WL1024 may be activated by any one of the first to 1024$^{th}$ row addresses RA1~RA1024 included in the row address RA. Each of memory cells connected to the first word line WL1 of the first memory bank 261 may be coupled to any one of bit lines. When the active operation for the first memory bank 261 is performed, levels of data stored in memory cells coupled to the first word line WL1 may be sensed and amplified. When the active operation for the first memory bank 261 is performed, an operation of the bit line sense amplifier 170_1 for a memory cell 268 coupled to the first word line WL1 will be described in detail hereinafter with reference to FIG. 11.

Figure 11:
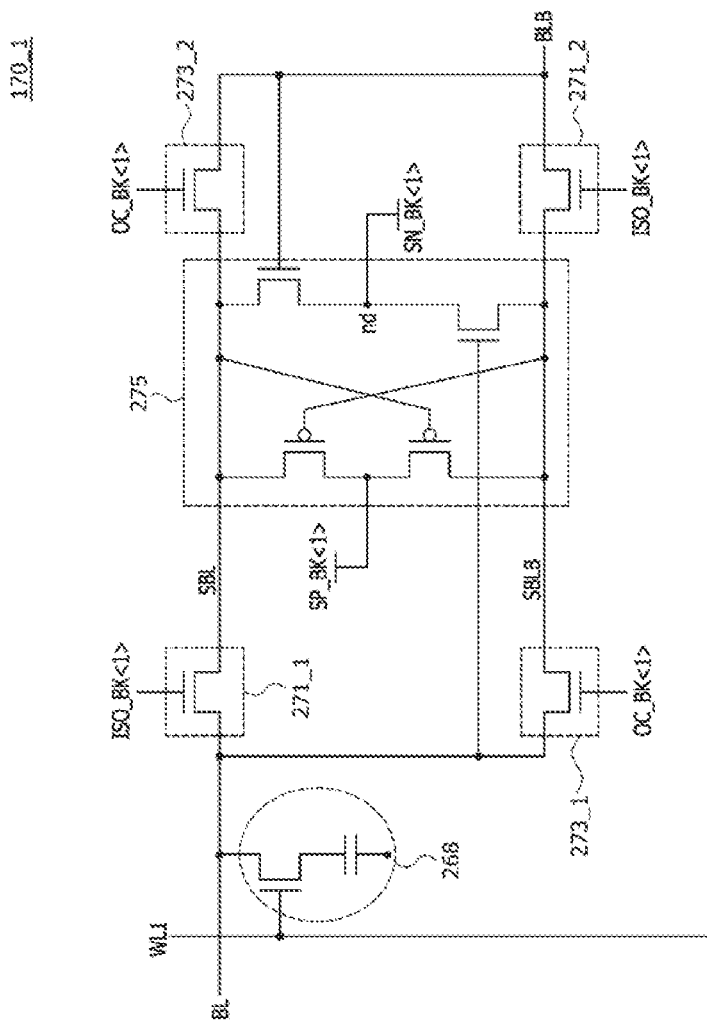
FIG. 11 is a circuit diagram illustrating a bit line sense amplifier of a sense amplification circuit included in the semiconductor device illustrated in FIG. 1.

As illustrated in FIG. 11, the bit line sense amplifier 170_1 may be coupled to the memory cell 268 through a bit line BL and may include a first isolation element 271_1, a second isolation element 271_2, a first offset removal element 273_1, a second offset removal element 273_2, and a cross-coupled latch 275. The memory cell 268 may be coupled to the first word line WL1 and the bit line BL. When the active operation for the first memory bank 261 is performed, the data stored in the memory cell 268 coupled to the first word line WL1 activated to have a logic "high" level may be sensed and amplified by the bit line sense amplifier 170_1 through the bit line BL. Each of the first and second isolation elements 271_1 and 271_2 may be realized using an NMOS transistor which is turned on based on a first bit signal ISO_BK<1> of the isolation signal ISO_BK. The first bit signal ISO_BK<1> of the isolation signal ISO_BK may be activated to have a logic "low" level during the offset removal operation, the charge sharing operation, and the overdriving operation of the bit line sense amplifier 170_1. In other embodiments, the bit line sense amplifier 170_1 may be designed such that the first bit signal ISO_BK<1> of the isolation signal ISO_BK is activated to have a logic "high" level. The first isolation element 271_1 may electrically disconnect the bit line BL from a sensing bit line SBL to isolate the memory cell 268 coupled to the bit line BL from the cross-coupled latch 275 during the offset removal operation, the charge sharing operation, and the overdriving operation of the bit line sense amplifier 170_1. The second isolation element 271_2 may electrically disconnect a complementary bit line BLB from a complementary sensing bit line SBLB to isolate a memory cell (not shown) coupled to the complementary bit line BLB from the cross-coupled latch 275 during the offset removal operation, the charge sharing operation, and the overdriving operation of the bit line sense amplifier 170_1. Each of the first and second offset removal elements 273_1 and 273_2 may be realized using an NMOS transistor which is turned on based on a first bit signal OC_BK<1> of the offset removal signal OC_BK. The first bit signal OC_BK<1> of the offset removal signal OC_BK may be activated to have a logic "high" level during the offset removal operation of the bit line sense amplifier 170_1. In other embodiments, the bit line sense amplifier 170_1 may be designed such that the first bit signal OC_BK<1> of the offset removal signal OC_BK is activated to have a logic "low" level. The first offset removal element 273_1 may electrically connect the bit line BL to the complementary sensing bit line SBLB during the offset removal operation of the bit line sense amplifier 170_1 to remove an offset voltage of the complementary sensing bit line SBLB generated by the cross-coupled latch 275 by transmitting a voltage level of the complementary sensing bit line SBLB to the bit line BL. The second offset removal element 273_2 may electrically connect the complementary bit line BLB to the sensing bit line SBL during the offset removal operation of the bit line sense amplifier 170_1 to remove an offset voltage of the sensing bit line SBL generated by the cross-coupled latch 275 by transmitting a voltage level of the sensing bit line SBL to the complementary bit line BLB. The cross-coupled latch 275 may receive the first bit signal SP_BK<1> of the first power signal SP_BK and the first bit signal SN_BK<1> of the second power signal SN_BK to sense and amplify a level of the data loaded on the bit line BL and may store the amplified data into the memory cell 268 again, during the sense/amplification operation of the bit line sense amplifier 170_1.

Figure 12:
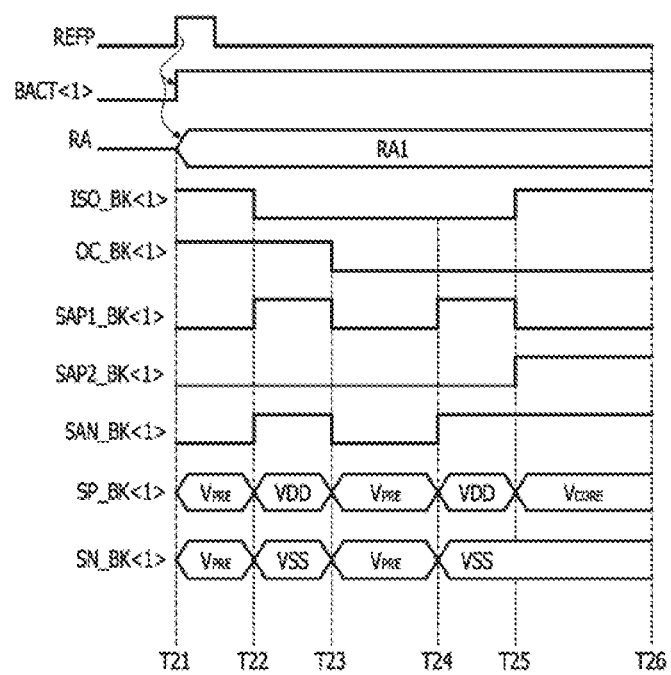
FIG. 12 is a timing diagram illustrating an operation of the bit line sense amplifier illustrated in FIG. 11.

An operation of the bit line sense amplifier 170_1 illustrated in FIG. 11 will be described more fully hereinafter with reference to a timing diagram illustrated in FIG. 12 in conjunction with a case in which the first bit signal BACT<1> of the bank active signal BACT is activated to have a logic "high" level and the first row address RA1 of the row address RA is generated to activate the first word line WL1 when the active operation for the first memory bank 261 is performed so that the refresh signal REFP is generated to have a logic "high" level.

First, because both of the first bit signal ISO_BK<1> of the isolation signal ISO_BK and the first bit signal OC_BK<1> of the offset removal signal OC_BK are set to have a logic "high" level during a period (from a point in time "T21" until a point in time "T22") when the pre-charge operation of the bit line sense amplifier 170_1 is performed, all of the bit line BL, the sensing bit line SBL, the complementary bit line BLB, and the complementary sensing bit line SBLB may be electrically connected to each other. Thus, all of the bit line BL, the sensing bit line SBL, the complementary bit line BLB, and the complementary sensing bit line SBLB may be pre-charged to have a bit line pre-charge voltage $V_{PRE}$. During the period (from the point in time "T21" until the point in time "T22") when the pre-charge operation of the bit line sense amplifier 170_1 is performed, all of the first bit signal SAP1_BK<1> of the first power control signal SAP1_BK, the first bit signal SAP2_BK<1> of the second power control signal SAP2_BK, and the first bit signal SAN_BK<1> of the third power control signal SAN_BK may be set to have a logic "low" level. Thus, both of the first bit signal SP_BK<1> of the first power signal SP_BK and the first bit signal SN_BK<1> of the second power signal SN_BK may be set to have the bit line pre-charge voltage $VP_{PRE}$.

Next, because the first bit signal ISO_BK<1> of the isolation signal ISO_BK is set to have a logic "low" level and the first bit signal OC_BK<1> of the offset removal signal OC_BK is set to have a logic "high" level during a period (from the point in time "T22" until a point in time "T23") when the offset removal operation of the bit line sense amplifier 170_1 is performed, the complementary sensing bit line SBLB may be connected to the bit line BL and the sensing bit line SBL may be connected to the complementary bit line BLB. Thus, an offset voltage of the sensing bit line SBL may be transmitted to the complementary bit line BLB, and an offset voltage of the complementary sensing bit line SBLB may be transmitted to the bit line BL. Because both of the first bit signal SAP1_BK<1> of the first power control signal SAP1_BK and the first bit signal SAN_BK<1> of the third power control signal SAN_BK are set to have a logic "high" level during the period (from the point in time "T22" until a point in time "T23") when the offset removal operation of the bit line sense amplifier 170_1 is performed, the first bit signal SP_BK<1> of the first power signal SP_BK may be driven to the power source voltage VDD and the first bit signal SN_BK<1> of the second power signal SN_BK may be driven to the ground voltage VSS.

Next, because both of the first bit signal ISO_BK<1> of the isolation signal ISO_BK and the first bit signal OC_BK<1> of the offset removal signal OC_BK are set to have a logic "low" level during a period (from the point in time "T23" until a point in time "T24") when the charge sharing operation of the bit line sense amplifier 170_1 is performed, all of the bit line BL, the sensing bit line SBL, the complementary bit line BLB, and the complementary sensing bit line SBLB may be electrically disconnected from each other. During the period (from the point in time "T23" until a point in time "T24") when the charge sharing operation of the bit line sense amplifier 170_1 is performed, all of the first bit signal SAP1_BK<1> of the first power control signal SAP1_BK, the first bit signal SAP2_BK<1> of the second power control signal SAP2_BK, and the first bit signal SAN_BK<1> of the third power control signal SAN_BK may be set to have a logic "low" level. Thus, both of the first bit signal SP_BK<1> of the first power signal SP_BK and the first bit signal SN_BK<1> of the second power signal SN_BK may be set to have the bit line pre-charge voltage $V_{PRE}$.

Next, because both of the first bit signal ISO_BK<1> of the isolation signal ISO_BK and the first bit signal OC_BK<1> of the offset removal signal OC_BK are set to have a logic "low" level during a period (from the point in time "T24" until a point in time "T25") when the overdriving operation of the bit line sense amplifier 170_1 is performed, all of the bit line BL, the sensing bit line SBL, the complementary bit line BLB, and the complementary sensing bit line SBLB may be electrically disconnected from each other. During the period (from the point in time "T24" until the point in time "T25") when the overdriving operation of the bit line sense amplifier 170_1 is performed, both of the first bit signal SAP1_BK<1> of the first power control signal SAP1_BK and the first bit signal SAN_BK<1> of the third power control signal SAN_BK may be set to have a logic "high" level. Thus, the first bit signal SP_BK<1> of the first power signal SP_BK may be driven to the power source voltage VDD, and the first bit signal SN_BK<1> of the second power signal SN_BK may be driven to the ground voltage VSS.

Next, because the first bit signal ISO_BK<1> of the isolation signal ISO_BK is set to have a logic "high" level and the first bit signal OC_BK<1> of the offset removal signal OC_BK is set to have a logic "low" level during a period (from the point in time "T25" until a point in time "T26") when the sense/amplification operation of the bit line sense amplifier 170_1 is performed, the bit line BL and the sensing bit line SBL may be electrically connected to each other and the complementary bit line BLB and the complementary sensing bit line SBLB may be electrically connected to each other. Thus, a voltage level of the sensing bit line SBL may be transmitted to the bit line BL, and a voltage level of the complementary sensing bit line SBLB may be transmitted to the complementary bit line BLB. During the period (from the point in time "T25" until the point in time "T26") when the sense/amplification operation of the bit line sense amplifier 170_1 is performed, both of the first bit signal SAP2_BK<1> of the second power control signal SAP2_BK and the first bit signal SAN_BK<1> of the third power control signal SAN_BK may be set to have a logic "high" level. Thus, the first bit signal SP_BK<1> of the first power signal SP_BK may be driven to the core voltage VCORE, and the first bit signal SN_BK<1> of the second power signal SN_BK may be driven to the ground voltage VSS.

Figure 13:
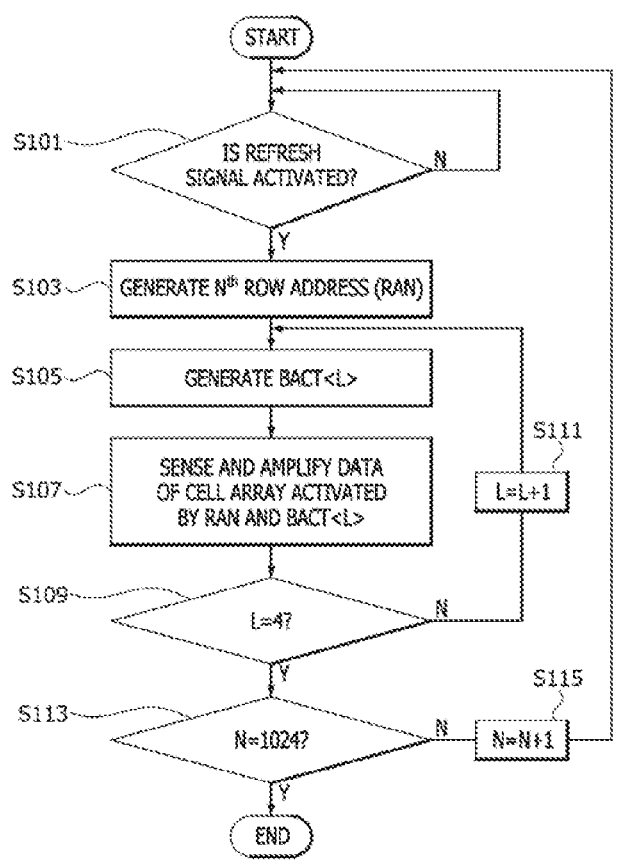
FIG. 13 is a flowchart illustrating a refresh operation for the data storage circuit illustrated in FIG. 10.

FIG. 13 is a flowchart illustrating the refresh operation for the data storage circuit 150 illustrated in FIG. 10. The data storage circuit 150 illustrated in FIG. 10 may include four memory banks, and each of the memory banks may include a cell array connected to 1024 word lines. The refresh operation for the cell arrays included in all of the memory banks in the data storage circuit 150 will be described hereinafter with reference to FIG. 13.

First, whether the refresh signal REFP is activated or not may be determined (see step S101). When the refresh signal REFP is activated at the step S101, the $N^{th}$ row address RAN may be generated (see step S103). When the refresh signal REFP is inactivated at the step S101, the semiconductor device 10 may stand by until the refresh signal REFP is activated. When the $N^{th}$ row address RAN is generated at the step S103, the $L^{th}$ bit signal BACT<L> of the bank active signal BACT may be generated (see step S105). In an embodiment, when the refresh signal REFP is activated a first time, the semiconductor device 10 may be configured to activate the first row address RA1 of the row address RA and the first bit signal BACT<1> of the bank active signal BACT. The data stored in memory cells included in the cell array activated by the first row address RA1 of the row address RA and the first bit signal BACT<1> of the bank active signal BACT may be sensed and amplified by the bit line sense amplifier (see step S107).

Next, whether the activated memory bank is the last memory bank may be determined. That is, because the data storage circuit 150 illustrated in FIG. 10 includes four memory banks, whether the fourth bit signal BACT<4> of the bank active signal BACT is generated (i.e., whether the bit number "L" of the bank active signal BACT is four) may be determined (see step S109). When the fourth bit signal BACT<4> of the bank active signal BACT is not generated, the bit number "L" may increases by "1" (see step S111) and the step S105 and the step S107 may be executed again. For example, after the active operation for the first memory bank 261 is performed, the second bit signal BACT<2> of the bank active signal BACT may be generated to perform the active operation for the second memory bank 263. When the fourth bit signal BACT<4> of the bank active signal BACT is generated and the sense/amplification operation for all of the data stored in memory cells activated by the first row address RA1 of the row address RA and the fourth bit signal BACT<4> of the bank active signal BACT is performed, the active operation for the memory cells coupled to the first word lines WL1 activated by the first row address RA1 may terminate.

Finally, whether the row address is the last row address may be determined. Each of the memory banks 261, 263, 265, and 267 included in the data storage circuit 150 illustrated in FIG. 10 includes 1024 word lines, the row address RA may also include 1024 row addresses. Thus, whether the $1024^{th}$ row address RA1024 is generated (i.e., whether the row address number "N" is "1024") may be determined (see step S113). When the $1024^{th}$ row address RA1024 is not generated at the step S113, the row address number "N" may increase by "1" to perform the active operation for the next row address (see step S115) and the steps S101, S103, S105, S107, S109, and S111 may be executed iteratively until the row address number "N" is "1024." For example, after the active operation for the data stored in memory cells coupled to all of the first word lines WL1 is performed by the first row address RA1, the second row address RA2 may be generated to perform the active operation for the data stored in memory cells coupled to all of the second word lines WL2. When the sense/amplification operation for the data stored in all of memory cells coupled to the $1024^{th}$ word lines WL1024 activated by the $1024^{th}$ row address RA1024 and the fourth bit signal BACT<4> of the bank active signal BACT, the refresh operation may terminate because the data stored in all of memory cells included in the data storage circuit 150 are sensed and amplified.

An operation of activating the second bit signal BACT<2> of the bank active signal BACT for performing the active operation for the second memory bank (263 of FIG. 10) after the first bit signal BACT<1> of the bank active signal BACT is activated to perform the active operation for the first memory bank (261 of FIG. 10) will be described hereinafter with reference to FIGS. 14 to 17.

Figure 14:
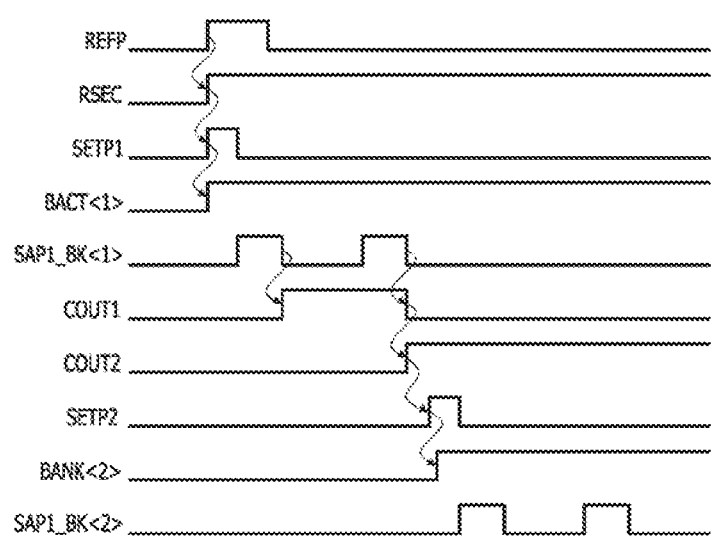
FIGS. 14 to 17 illustrate an operation for sequentially generating a first bank active signal and a second bank active signal during a refresh operation performed in the semiconductor device illustrated in FIG. 1.
Figure 15:
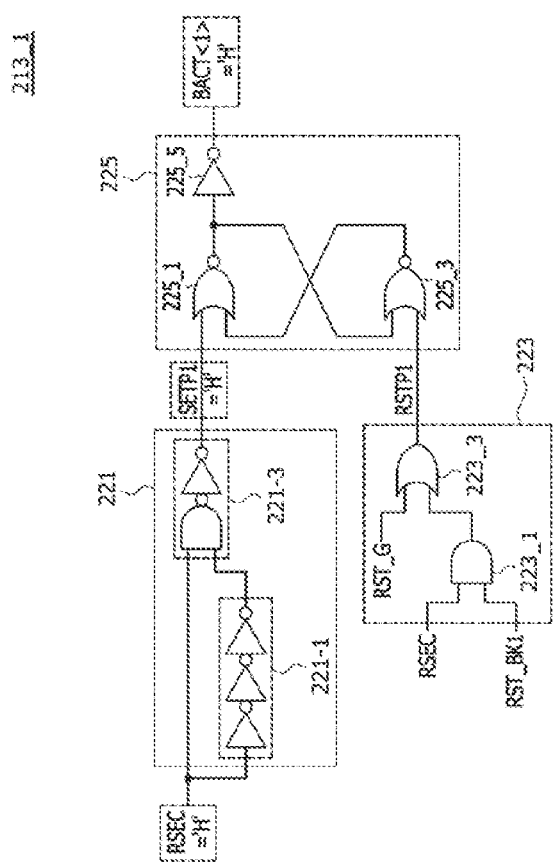

As illustrated in FIG. 14, when the refresh signal REFP is activated to have a logic "high" level, the section signal RSEC may be activated to have a logic "high" level. Referring to FIGS. 14 and 15, when the section signal RSEC is activated, the first set signal SETP1 may be activated to have a logic "high" level so that the first bit signal BACT<1> of the bank active signal BACT is activated to have a logic "high" level to start the active operation for the first memory bank 261.

Figure 16:
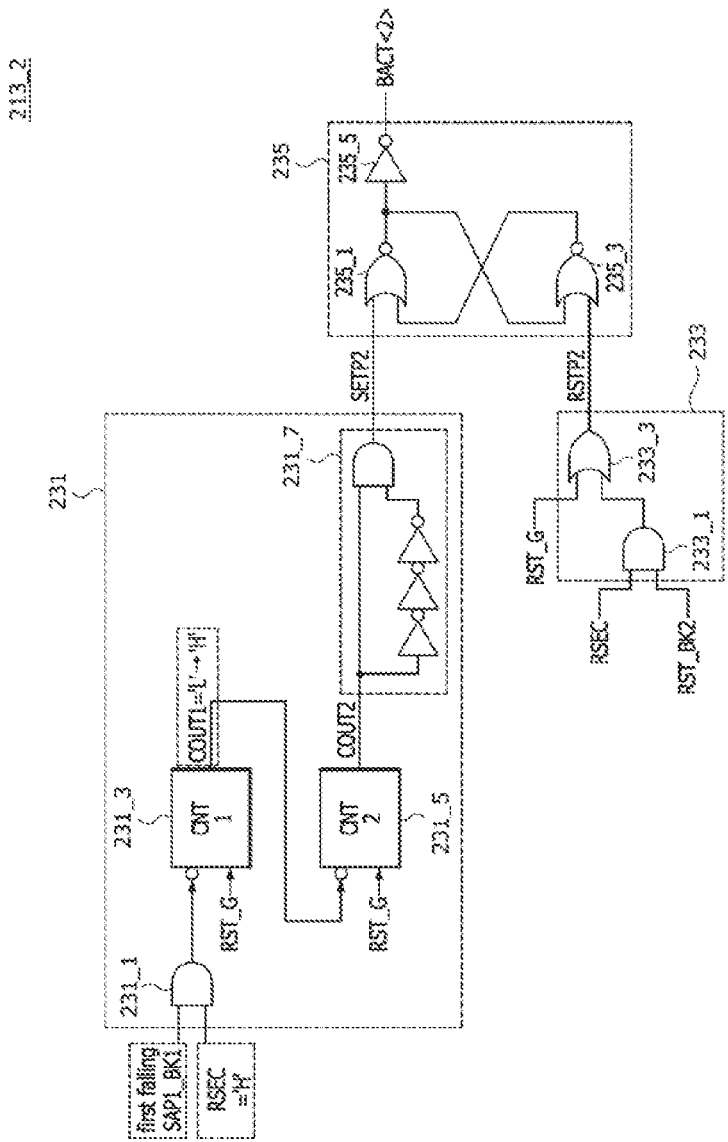
Figure 17:
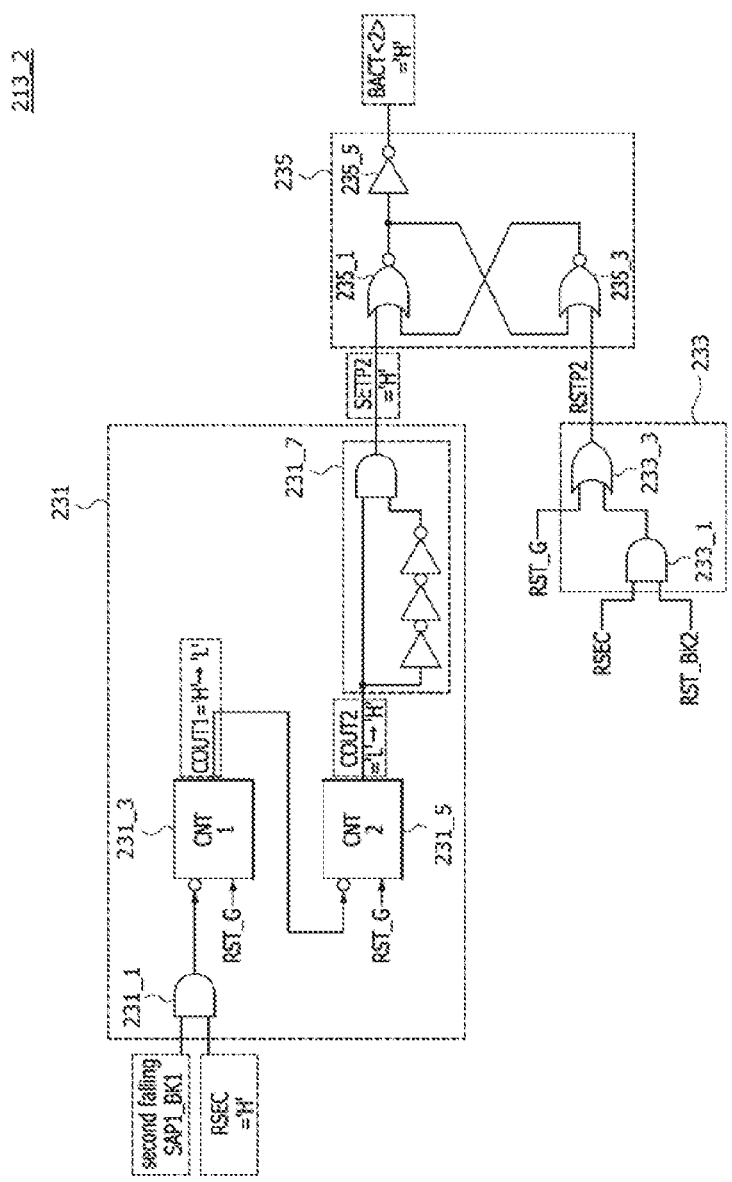

As illustrated in FIG. 14, the first bit signal SAP1_BK<1> of the first power control signal SAP1_BK may be generated to have a logic "high" level during the offset removal operation and the overdriving operation of the bit line sense amplifier. Referring to FIGS. 14 and 16, while the section signal RSEC is activated to have a logic "high" level, a level of the first counter output signal COUT1 may change from a logic "low" level into a logic "high" level in synchronization with a first falling edge of the first bit signal SAP1_BK<1> of the first power control signal SAP1_BK. Referring to FIGS. 14 and 17, while the section signal RSEC is activated to have a logic "high" level, a level of the first counter output signal COUT1 may change from a logic "high" level into a logic "low" level and a level of the second counter output signal COUT2 may change from a logic "low" level into a logic "high" level in synchronization with a second falling edge of the first bit signal SAP1_BK<1> of the first power control signal SAP1_BK.

Referring to FIGS. 14 and 17, when the second counter output signal COUT2 is activated to have a logic "high" level, the second set signal SETP2 may be activated to have a logic "high" level so that the second bit signal BACT<2> of the bank active signal BACT is activated to have a logic "high" level to start the active operation for the second memory bank 263. As illustrated in FIG. 14, the second bit signal SAP1_BK<2> of the first power control signal SAP1_BK may be generated to have a logic "high" level during the offset removal operation and the overdriving operation of the bit line sense amplifier.

As described above, the semiconductor device 10 according to an embodiment may terminate supplying a power source voltage to a bit line sense amplifier during an active operation for one memory bank and may then perform the active operation for another memory bank, while a refresh operation for a plurality of memory banks is performed. Thus, it may prevent periods for supplying the power source voltage from being superposed during the active operation for the plurality of memory banks. Accordingly, it may be possible to stably maintain a level of the power source voltage.

What is claimed is:

1. A device for performing a refresh operation, the device comprising:
    a row control circuit configured to generate a bank active signal and a row address for controlling an active operation for a first memory bank based on a refresh signal and configured to generate the bank active signal for controlling the active operation for a second memory bank based on a power control signal; and
    a row decoder configured to receive the bank active signal and the row address to control the active operation for the first memory bank and the second memory bank,
    wherein the power control signal is generated to control driving a power signal which is supplied to a bit line sense amplifier to perform the active operation for the first memory bank, wherein the row address includes a first row address and a second row address, wherein the row control circuit is configured to sequentially generate the first row address and the second row address when the refresh signal is activated, wherein the row control circuit is configured to generate the first row address to select a first word line of the first memory bank and a first word line of the second memory bank, and wherein the row control circuit is configured to generate the second row address to select a second word line of the first memory bank and a second word line of the second memory bank.

2. The device of claim 1, wherein the row control circuit is configured to:
   activate a first bit signal of the bank active signal to perform the active operation for the first memory bank; and
   activate a second bit signal of the bank active signal to perform the active operation for the second memory bank.

3. The device of claim 1, wherein the power control signal is activated to perform an offset removal operation and an overdriving operation of the bit line sense amplifier.

4. The device of claim 1, wherein the power signal is provided by an external device.

5. The device of claim 1, wherein the row control circuit includes:
   a section signal generation circuit configured to generate a section signal based on the refresh signal; and
   a first bank active signal generation circuit configured to generate a first bit signal of the bank active signal, which is activated to perform the active operation for the first memory bank, based on the section signal.

6. The device of claim 5, wherein the section signal generation circuit is configured to:
   generate the section signal which is activated when the refresh signal is activated; and
   generate the section signal which is inactivated when the active operation for all of the first and second memory banks terminates.

7. The device of claim 5, wherein the first bank active signal generation circuit is configured to:
   generate the first bit signal of the bank active signal which is activated when the section signal is activated; and
   generate the first bit signal of the bank active signal which is inactivated when a first bit signal of a bank reset signal is activated.

8. The device of claim 7, wherein the row control circuit further includes a first bank reset signal generation circuit that is configured to generate the first bit signal of the bank reset signal which is activated in synchronization with a point in time when the active operation for the first memory bank terminates.

9. The device of claim 5, wherein the row control circuit further includes a second bank active signal generation circuit configured to generate a second bit signal of the bank active signal, which is activated to perform the active operation for the second memory bank, based on the section signal and the power control signal.

10. The device of claim 9, wherein the second bank active signal generation circuit is configured to:
    generate the second bit signal of the bank active signal which is activated in synchronization with a point in time when supplying the power signal to the bit line sense amplifier terminates based on the power control signal while the section signal is activated; and
    generate the second bit signal of the bank active signal which is inactivated when a second bit signal of a bank reset signal is activated.

11. The device of claim 10, wherein the row control circuit further includes a second bank reset signal generation circuit that is configured to generate a second bit signal of the bank reset signal which is activated in synchronization with a point in time when the active operation for the second memory bank terminates.

12. A device for performing a refresh operation, the device comprising:
    a section signal generation circuit configured to generate a section signal based on the refresh signal;
    a first bank active signal generation circuit configured to generate a first bit signal of a bank active signal, which is activated to perform an active operation for a first memory bank, based on the section signal;
    a second bank active signal generation circuit configured to generate a second bit signal of the bank active signal, which is activated to perform the active operation for a second memory bank, based on the section signal and a power control signal; and
    a row address generation circuit configured to sequentially generate a first row address and a second row address based on the refresh signal,
    wherein the power control signal is generated to control driving a power signal which is supplied to a bit line sense amplifier to perform the active operation for the first memory bank,
    wherein the row address generation circuit is configured to generate the first row address to select a first word line of the first memory bank and a first word line of the second memory bank; and
    wherein the row address generation circuit is configured to generate the second row address to select a second word line of the first memory bank and a second word line of the second memory bank.

13. The device of claim 12, wherein the section signal generation circuit is configured to:
    generate the section signal which is activated when the refresh signal is activated; and
    generate the section signal which is inactivated when the active operation for all of the first and second memory banks terminates.

14. The device of claim 12, wherein the first bank active signal generation circuit is configured to:
    generate the first bit signal of the bank active signal which is activated when the section signal is activated; and
    generate the first bit signal of the bank active signal which is inactivated when a first bit signal of a bank reset signal is activated.

15. The device of claim 12, wherein the second bank active signal generation circuit is configured to:
    generate the second bit signal of the bank active signal which is activated in synchronization with a point in time when supplying the power signal to the bit line sense amplifier terminates based on the power control signal while the section signal is activated; and
    generate the second bit signal of the bank active signal which is inactivated when a second bit signal of a bank reset signal is activated.

16. The device of claim 12, wherein the power control signal is activated to perform an offset removal operation and an overdriving operation of the bit line sense amplifier.

* * * * *